(12) United States Patent
Chuang et al.

(10) Patent No.: US 7,922,921 B2
(45) Date of Patent: Apr. 12, 2011

(54) METHOD FOR FABRICATING LIQUID CRYSTAL DISPLAY PANEL ARRAY

(75) Inventors: Chih-Chung Chuang, Taipei Hsien (TW); Shin-Jien Kuo, Taipei (TW); Chao-Yun Cheng, Tao-Yuan Hsien (TW); Shu-Feng Wu, Tao-Yuan Hsien (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 53 days.

(21) Appl. No.: 10/708,642

(22) Filed: Mar. 17, 2004

(65) Prior Publication Data
US 2004/0209471 A1 Oct. 21, 2004

(30) Foreign Application Priority Data
Apr. 17, 2003 (TW) .............................. 92109003 A

(51) Int. Cl.
*H01L 21/302* (2006.01)
(52) U.S. Cl. .............................. 216/23; 438/30; 438/706
(58) Field of Classification Search .................. 216/23, 216/41, 67, 75; 438/23, 30, 706
See application file for complete search history.

(56) References Cited

U.S. PATENT DOCUMENTS

| 4,904,980 | A | * | 2/1990 | Przybysz et al. | ............... | 338/307 |
| 4,981,816 | A | * | 1/1991 | Kim et al. | ............... | 438/648 |
| 5,354,417 | A | * | 10/1994 | Cheung et al. | ............... | 438/721 |
| 5,445,710 | A | * | 8/1995 | Hori et al. | ............... | 438/717 |
| 5,554,488 | A | * | 9/1996 | Rioux | ............... | 430/315 |
| 6,429,027 | B1 | * | 8/2002 | Chee et al. | ............... | 436/518 |
| 6,429,057 | B1 | * | 8/2002 | Hong et al. | ............... | 438/158 |
| 6,809,790 | B2 | * | 10/2004 | Yamagishi et al. | ............... | 349/139 |
| 2003/0122987 | A1 | * | 7/2003 | Kim et al. | ............... | 349/43 |
| 2003/0143853 | A1 | * | 7/2003 | Celii et al. | ............... | 438/694 |

FOREIGN PATENT DOCUMENTS
JP 05067590 A * 3/1993

OTHER PUBLICATIONS

Wilson,1993, William Andrews/Noyes, Handbook of Multilevel metalization for Integrated Circuits—Materials, Technology, and Applications; p. 149-150.*
http://www.semiconductorglossary.com/; term LCD; viewed Feb. 2007.*

* cited by examiner

*Primary Examiner* — Keith D Hendricks
*Assistant Examiner* — Patricia A George
(74) *Attorney, Agent, or Firm* — Winston Hsu; Scott Margo

(57) ABSTRACT

The present invention includes the steps of providing a substrate having a main surface; depositing a dual-metal layer such as Mo/AlNd, MoW/AlNd, MoW/Al onto the main surface of the substrate; defining gate and word line patter using a layer of photoresist; and using the photoresist as an etching mask, a first metal dry etching process is carried out to etch the dual-metal layer at an etching selectivity that is significantly higher than prior art. The first metal dry etching process uses oxygen/fluorine containing etching gas mixture and oxygen/chlorine containing etching gas mixture to form the dual-metal gate and word line pattern having slightly oblique sidewalls. End point detection mode detected at 704 nm is used in the first metal dry etching process.

8 Claims, 3 Drawing Sheets

|  | Prior Art | Example 1 | Example 2 |
|---|---|---|---|
| Source Power (W) | 2500 | 3000 | 3000 |
| Bias Power(W) | 1200 | 1200 | 1200 |
| Process Pressure (mT) | 20 | 60 | 25 |
| O$_2$ (sccm) | 650 | 200 | 300 |
| SF$_6$ (sccm) | 650 | 800 | 700 |
| E/R (Å/min) | 743 | 1436 | 2101 |
| Uniformity (%) | 29.5 | 20.9 | 21 |

|  | Prior Art | Example 1 | Example 2 |
|---|---|---|---|
| Source Power (W) | 2500 | 3000 | 3000 |
| Bias Power (W) | 1200 | 1200 | 1200 |
| Process Pressure (mT) | 20 | 60 | 25 |
| $O_2$ (sccm) | 650 | 200 | 300 |
| $SF_6$ (sccm) | 650 | 800 | 700 |
| E/R (Å/min) | 743 | 1436 | 2101 |
| Uniformity (%) | 29.5 | 20.9 | 21 |

Fig. 1

PR Ashing

|  | MoW | | AlNd |
|---|---|---|---|
|  | Prior Art | Example 2 |  |
| A/R (Å/min) | 1889 | 1006.653 | 1995.35 |
| Uniformity (%) | 12.10 | 25.57 | 38.90 |

Fig. 3

METHOD FOR FABRICATING LIQUID CRYSTAL DISPLAY PANEL ARRAY

BACKGROUND OF INVENTION

1. Field of the Invention

The present invention relates generally to front-end processing for making liquid crystal display devices. More particularly, the present invention relates to a method for making a liquid crystal display devices capable of alleviating or eliminating Mura and white pad defects.

2. Description of the Prior Art

The uses of a liquid crystal flat panel displays (LCFPD) continue to grow rapidly. Consumer items such as portable video recorders, pocket televisions, notebook computers, high-definition televisions (HDTV), and the like incorporate such displays. Based upon the continued demand for such displays, the industry has made massive capital investments to create state-of-art manufacturing lines.

Major classes of LCFPD defects encountered at the final inspection are often pixel defects or wide-area pixel defects (also known as Mura defects). Problems in the manufacturing process of the LCFPD often cause Mura defects. Because certain manufacturing problems cause certain types of Mura defects, thus identification and elimination of the manufacturing problems often leads to the reduction of Mura defects during subsequent processing runs.

Mura defects are defined as areas of illumination (pixels on the substrate) which are different, or anomalous, from the neighborhood surrounding the defect, also termed Patterned Brightness Non-Uniformity (BNU). The BNU is generally measured by an image acquisition device position normal to the LCFPD and the BNU is generally of very low contrast. Regions of a substrate often include pixels that appear either brighter or darker than pixels surrounding the region, and are classified as Mura defects when specific contrast threshold limits, BNUs, are reached or exceeded. It is important to note that the boundaries for Mura defects are not always well defined and further, within a Mura defect, the BNU may not be homogenous.

Typically, in order to manufacture a liquid crystal display panel, a metal-array forming process is first carried out, which comprises providing a clean glass substrate surface; depositing a dual-layer metal film onto the surface of the substrate; and defining and etching an array pattern (gate pattern and word line pattern) of the dual-layer metal film using conventional lithographic and metal etching methods. The dual-layer metal film may include Mo/AlNd, MoW/AlNd, or MoW/Al. The etching of the dual-layer metal film leads to slightly oblique sidewalls of the defined word lines or gate lines on the substrate. Etching gas mixtures such as oxygen/fluorine containing gases and oxygen/chlorine containing gases are used to etch Mo or MoW (the upper layer of the dual-layer metal film). Etching is often ceased by time mode (etching rate controlled). An over etch is usually carried out.

One obstacle to making a non-Mura panel is insufficient etching selectivity between the upper layer (Mo or MoW) and the lower layer (AlNd or Al) during the etching. At an array final inspect stage, circular or irregular Mura defects are often observed on the panel. According to results based on optical and electron microscopic analyses, the circular Mura defects are most likely related to rough oblique sidewalls of the etched dual-layer metal lines in a center area of the panel, while the irregular Mura defects are most likely related to small spacing between the upper layer metal and the lower layer metal.

SUMMARY OF INVENTION

The primary object of the present invention is to provide an improved method for fabricating liquid crystal display devices, thereby alleviating or eliminating Mura defects of LCD panels.

Another object of the present invention is to provide a method for forming a Mo/AlNd, MoW/AlNd, or MoW/Al dual-layer metal array of LCD panels by using End-Point Detection (EPD) instead of prior art time-mode etching.

The preferred embodiment of the present invention includes the steps of providing a substrate having a main surface; depositing a dual-metal layer such as Mo/AlNd, MoW/AlNd, MoW/Al onto the main surface of the substrate; defining gate and word line patterns using layers of photoresists; and using the photoresists as an etching mask, a first metal dry etching process is carried out to etch the dual-metal layer at an etching selectivity that is significantly higher than prior art. The first metal dry etching process uses oxygen/fluorine containing etching gas mixture and oxygen/chlorine containing etching gas mixture to form the dual-metal gate and word line patterns having slightly oblique sidewalls. End point detection mode is used in the first metal dry etching process.

The present invention is emphasized on the improvement of uniformly etching of the upper metal of the dual-metal layer. Further, the etching selectivity between the upper metal and the lower metal of the dual-layer layer is increased such that more reliable end-point detection in the first metal dry etching process can be used. In addition, to avoid so-called white pad effects, the ashing rate of the photoresist is reduced due to recipe change.

Other objects, advantages, and novel features of the claimed invention will become more clearly and readily apparent from the following detailed description when taken in conjunction with the accompanying drawings.

BRIEF DESCRIPTION OF DRAWINGS

FIG. 1 illustrates a comparison table comparing with a prior art etching method and two preferred examples of this invention, in aspects including etching recipes, etching rates (E/R), and uniformity.

FIG. 3 demonstrates a schematic diagram showing the etching uniformity on a panel surface, wherein figures within the panel areas stand for different etching rates (in an unit of angstroms/min).

DETAILED DESCRIPTION

Figure 2:
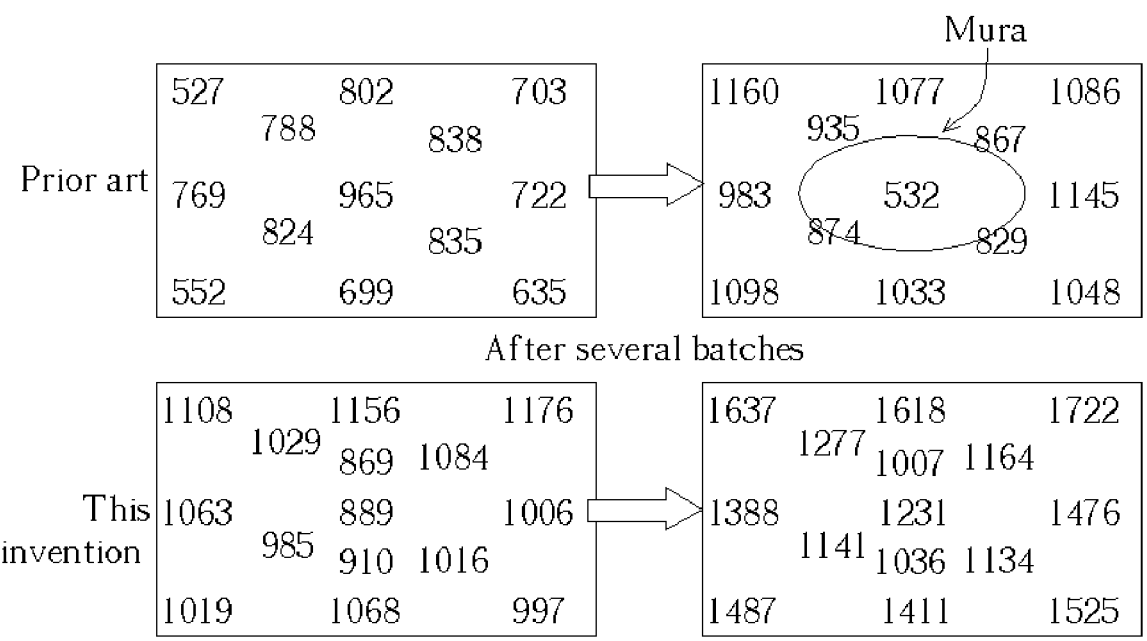
FIG. 2 demonstrates a table showing ashing rate reduction of the photoresist during the first metal dry etching process.

The present invention is directed to an improved first photolithographic and etching processing step of the front-end array manufacture of liquid crystal display panels. The improved first photolithographic and etching processing step is used to define gate and word line pattern made of dual-metal structure such as Mo/AlNd, MoW/AlNd, or MoW/Al on a flat, clean surface of a glass substrate. According to one preferred embodiment of this invention, the upper metal layer such as Mo or MoW of the dual-metal structure is etched by means of an end-point detection method, instead of prior time-mode etching, thereby improving the etching uniformity though out the panel and avoiding Mura defects or white pad effects known in the art. It is to be understood that the present invention is particularly suitable for etching machine having single shower head, but should not be limiting. The etching machine may be induced coupled plasma (ICP) type, transformer coupled plasma (TCP) or the like.

Basically, the preferred embodiment of the present invention includes the steps of providing a substrate having a main surface; depositing a dual-metal layer such as Mo/AlNd, MoW/AlNd, MoW/Al onto the main surface of the substrate; defining gate and word line patterns using a layer of photoresist; and using the photoresist as an etching mask, a first metal dry etching process is carried out to etch the dual-metal layer at an etching selectivity that is significantly higher than prior art. The first metal dry etching process uses oxygen/fluorine containing etching gas mixture and oxygen/chlorine containing etching gas mixture to form the dual-metal gate and word line patterns having slightly oblique sidewalls. End-point detection mode is used in the above-described first metal dry etching process. It is noted that insufficient etching selectivity between the upper metal (molybdenum containing) and the lower metal of the dual-metal layer according to the prior art hinders the use of the reliable end-point detection method. It is found that most Mura defects results from the non-uniformly etching of the upper metal of the dual-metal layer. Accordingly, to eliminate Mura defects, the present invention is emphasized on the improvement of uniformly etching of the upper metal of the dual-metal layer. Further, the rates of the etching selectivity between the upper metal and the lower metal of the dual-metal layer is increased such that more reliable end-point detection in the first metal etching process can be used. In addition, to avoid so-called white pad effects, the ashing rate of the photoresist is reduced due to recipe change.

According to this invention, the improvement is achieved by way of the following aspects: (1) increasing etching uniformity; (2) increasing the rates of the etching selectivity between the upper metal such as Mo and the lower metal such as AlNd of the dual-metal layer; (3) increasing process pressure during the first metal dry etching process; (4) increasing etching rate of the upper metal layer of the dual-metal layer to reduce ashing rate of the photoresist (and also increasing etching selectivity); (5) detecting etching end point of the upper metal layer by end-point detection at a wavelength of about 704 nm, and using a 100% over etching thereafter. An unexpected result is found when the etching pressure during the first metal dry etching process is increased from 20 mTorr to higher than 25 mTorr. It is worthy noted that the additional more than 5 mTorr increase in pressure improves the etching uniformity due to the chemical etching is increased. The etching rate of the upper metal and the rates of the etching selectivity compared with the lower metal are increased by increasing the processing gas $SiF_6/O_2$ ratio from 650 sccm/650 sccm to 700 sccm/300 sccm.

With reference to FIG. 1, a comparison between a prior art etching method and two preferred examples of this invention, in aspects including etching recipes of etching rates (E/R) and uniformity is demonstrated. According to the prior art method, the source power is 2500 W, the bias power is 1200 W, the process pressure is 20 mTorr, the oxygen flowrate is 650 sccm (standard cubic centimeters per minute), fluorine-containing gas (such as $SF_6$) flowrate is 650 sccm. Based on the above-described prior art recipe, an etching rate (E/R) of 743 angstroms/min is obtained resulting in a poor uniformity of 29.5%. The uniformity is significantly improved to 20.9% and 21%, respectively, in the first preferred example and the second example. In the first preferred example, as shown in FIG. 1, the source power is increased to 3000 W. The bias power remains the same, i.e., 1200 W. The process pressure is increased to 60 mTorr. The oxygen flowrate is reduced to 200 sccm. The fluorine-containing gas (such as $SF_6$) flowrate is increased to 800 sccm. The E/R is increased to 1436 angstroms/min. In the second preferred example, the source power is also increased to 3000 W. The bias power remains at 1200 W. The process pressure is increased to 25 mTorr. The oxygen flowrate is reduced to 300 sccm. The fluorine-containing gas (such as $SF_6$) flowrate is increased to 700 sccm. The E/R is increased to 2101 angstroms/min. From above, it is found that by increasing process pressure and $SF_6/O_2$ ratio, the Mura defects can be improved.

As aforementioned, the etching uniformity of the upper metal of the dual-metal layer during the first metal dry etching process is poor because the etching uniformity under single shower head of the etching machine is difficult to control. To remedy this, an over etching process is executed to compensate the area of the panel that has relatively lower etching rate. The time mode etching method that is converted by MQC data including etching rate and uniformity according to a single metal film is not precise enough. Referring to FIG. 2, a schematic diagram showing the etching uniformity on a panel surface is demonstrated, wherein figures within the panel areas stand for different etching rates (in an unit of angstroms/min). According to the prior art method, a center area of the panel has a relatively lower etching rate after several batches run, and thus resulting in Mura defects. Therefore, one object of the present invention is to increase the etching rate in this center that has the tendency toward a lower etching rate under single shower head, and to maintain and equalize the etching uniformity through out the panel surface. Another object of the present invention is to reduce the ashing rate of the photoresist during the first metal dry etching process. To achieve this, the oxygen content is reduced, thereby avoiding white pad effects. Referring to FIG. 3, a table is shown to demonstrate ashing rate reduction of the photoresist during the first metal dry etching process.

In comparison with the prior art method, the improvement of the present invention is achieved by way of the following aspects: (1) increasing etching uniformity; (2) increasing rates of the etching selectivity between the upper metal such as Mo and the lower metal such as AlNd of the dual-metal layer; (3) increasing process pressure during the first metal dry etching process; (4) increasing etching rate of the upper metal layer of the dual-metal layer to reduce ashing rate of the photoresist (and also increasing etching selectivity); (5) detecting etching end point of the upper metal layer by end-point detection at a wavelength of about 704 nm, and using a 100% over etching thereafter.

Those skilled in the art will readily observe that numerous modifications and alterations of the present invention method may be made while retaining the teachings of the invention. Accordingly, the above disclosure should be construed as limited only by the metes and bounds of the appended claims.

What is claimed is:

1. A front-end array process for making a liquid crystal display panel, comprising:
   depositing a molybdenum-containing metal layer on a glass substrate;
   forming a patterned photoresist and defining a gate and word line array pattern on said molybdenum-containing metal layer; and
   etching said molybdenum-containing metal layer by using fluorine/oxygen containing gas mixture containing SF6/O2 with a ratio of about 700 sccm/300 sccm, and using said patterned photoresist as an etching mask to form said gate and word line array pattern.

2. The front-end array process for making a liquid crystal display panel according to claim 1 wherein said gate and word line array pattern have substantially oblique sidewalls.

3. The front-end array process for making a liquid crystal display panel according to claim 1 wherein after said etching of said molybdenum-containing metal layer, an over etching is carried out.

4. The front-end array process for making a liquid crystal display panel according to claim 1 wherein said etching of said molybdenum-containing metal layer is executed under a process pressure higher than 25 mTorr.

5. The front-end array process for making a liquid crystal display panel according to claim 1 wherein said etching of said molybdenum-containing metal layer is detected by an end-point detection method at an wavelength of about 704 nm.

6. The front-end array process for making a liquid crystal display panel according to claim 1 wherein said molybdenum-containing metal layer is a dual-metal layer.

7. The front-end array process for making a liquid crystal display panel according to claim 6 wherein said dual-metal layer is Mo/AlNd, MoW/AlNd, or MoW/Al, wherein Mo and MoW are top layers, while AlNd and Al are bottom layers.

8. A front-end array process for making a liquid crystal display panel, comprising:
    depositing a molybdenum-containing metal layer on a glass substrate, wherein said molybdenum-containing metal layer is a dual-metal layer and said dual-metal layer is Mo/AlNd, MoW/AlNd, or MoW/Al, wherein Mo and MoW are top layers, while AlNd and Al are bottom layers;
    forming a patterned photoresist on said molybdenum-containing metal layer, wherein said patterned photoresist defines a gate and word line array pattern; and
    using said patterned photoresist as an etching mask, uniformly etching said molybdenum-containing metal layer to form said gate and word line array pattern having substantially oblique sidewalls, wherein said etching of said molybdenum-containing metal layer uses gas mixture, wherein said etching of said molybdenum-containing metal layer is detected by an end-point detection method.

* * * * *